(12) United States Patent
Klein

(10) Patent No.: US 6,492,598 B1
(45) Date of Patent: Dec. 10, 2002

(54) PRINTED CIRCUIT BOARD ASSEMBLY AND METHOD FOR MAKING A PRINTED CIRCUIT BOARD ASSEMBLY

(75) Inventor: Dean A. Klein, Lake City, MN (US)

(73) Assignee: Micron Technology, Inc., Boise, ID (US)

( * ) Notice: Subject to any disclaimer, the term of this patent is extended or adjusted under 35 U.S.C. 154(b) by 1060 days.

(21) Appl. No.: 08/565,090

(22) Filed: Nov. 30, 1995

(51) Int. Cl.[7] .................................................. H05K 7/06
(52) U.S. Cl. ...................... 174/256; 174/250; 174/258; 174/260; 174/262; 361/777
(58) Field of Search ........................... 29/825, 829, 846, 29/840, 843; 174/250, 251, 255, 256, 258, 260, 261, 262, 266, 267; 228/179.1, 180.1, 180.21, 180.22, 180.5; 257/723, 724, 786, 784; 333/181, 182, 185; 361/760, 748, 767, 771, 774, 775, 776, 777, 779, 782, 783, 805, 806; 439/63, 68, 81, 82, 83

(56) References Cited

U.S. PATENT DOCUMENTS

| 4,413,309 A | * 11/1983 | Takahashi et al. ........... 361/760 |
| 5,650,595 A | * 7/1997 | Bentlage et al. ............. 174/260 |

\* cited by examiner

Primary Examiner—David L. Talbott
Assistant Examiner—John B. Vigushin
(74) Attorney, Agent, or Firm—Trop, Pruner & Hu, P.C.

(57) ABSTRACT

A PCB assembly which allows economical and reliable rework. The PCB assembly contains a soldermask and a trace with a portion of the trace exposed by a soldermask relief. When one needs to rework the PCB assembly, one bonds a rework wire, using conventional intermetalic bonding materials, to the portion of the trace exposed by the soldermask relief. There is no need to bond a rework wire to a component. Further, there is no need to scrape off the soldermask and possibly damage the traces and/or vias. The bonds are high reliability bonds, and the labor required to perform such bonds are minimal.

4 Claims, 1 Drawing Sheet

PRINTED CIRCUIT BOARD ASSEMBLY AND METHOD FOR MAKING A PRINTED CIRCUIT BOARD ASSEMBLY

The U.S. Government has a paid-up license in this invention and the right in limited circumstances to require the patent owner to license others on reasonable terms as provided form the terms of contract No. MDA972-92-C-0054 awarded by the Advanced Research Projects Agency.

BACKGROUND OF THE INVENTION

This invention relates in general to printed circuit boards ("PCBs"). More particularly this invention relates to a PCB assembly that can be economically and reliably reworked.

A person who designs and builds a PCB does not normally intend for the PCB to be reworked. PCBs often do need to be reworked, however. This need for reworking can be due to PCB layout errors, incorrect component selection, a change in design parameters, or any number of reasons. As is well known, reworking PCBs, especially PCBs with surface mount components, is difficult.

One conventional method to rework a PCB involves bonding rework wires to component leads. This task is labor intensive, especially with surface mount components. In addition, proper bonds between component leads and rework wires are difficult to achieve. Further, during the bonding process, the component may be damaged.

Another conventional method to rework a PCB involves scraping off the soldermask from PCB traces and/or PCB vias and attaching a rework wire to the exposed metal. In addition to being labor intensive, such methods often create surface imperfections in the exposed traces and/or vias. The surface imperfections, under certain environmental conditions such as shock, vibration, and/or temperature fluctuations, can fatigue and cause failures.

SUMMARY OF THE INVENTION

The invention relates to a PCB assembly which allows economical and reliable rework. The PCB assembly contains a soldermask and a trace with a portion of the trace exposed by a soldermask relief. When the PCB assembly requires rework, a rework wire is bonded, using conventional intermetalic bonding materials, to the portion of the trace exposed by the soldermask relief. There is no need to bond a rework wire to a component. Further, there is no need to scrape off the soldermask and possibly damage the traces and/or vias. The bonds are high reliability bonds, and the labor required to perform such bonds are minimal.

DETAILED DESCRIPTION OF SPECIFIC EMBODIMENTS

Figure 1:
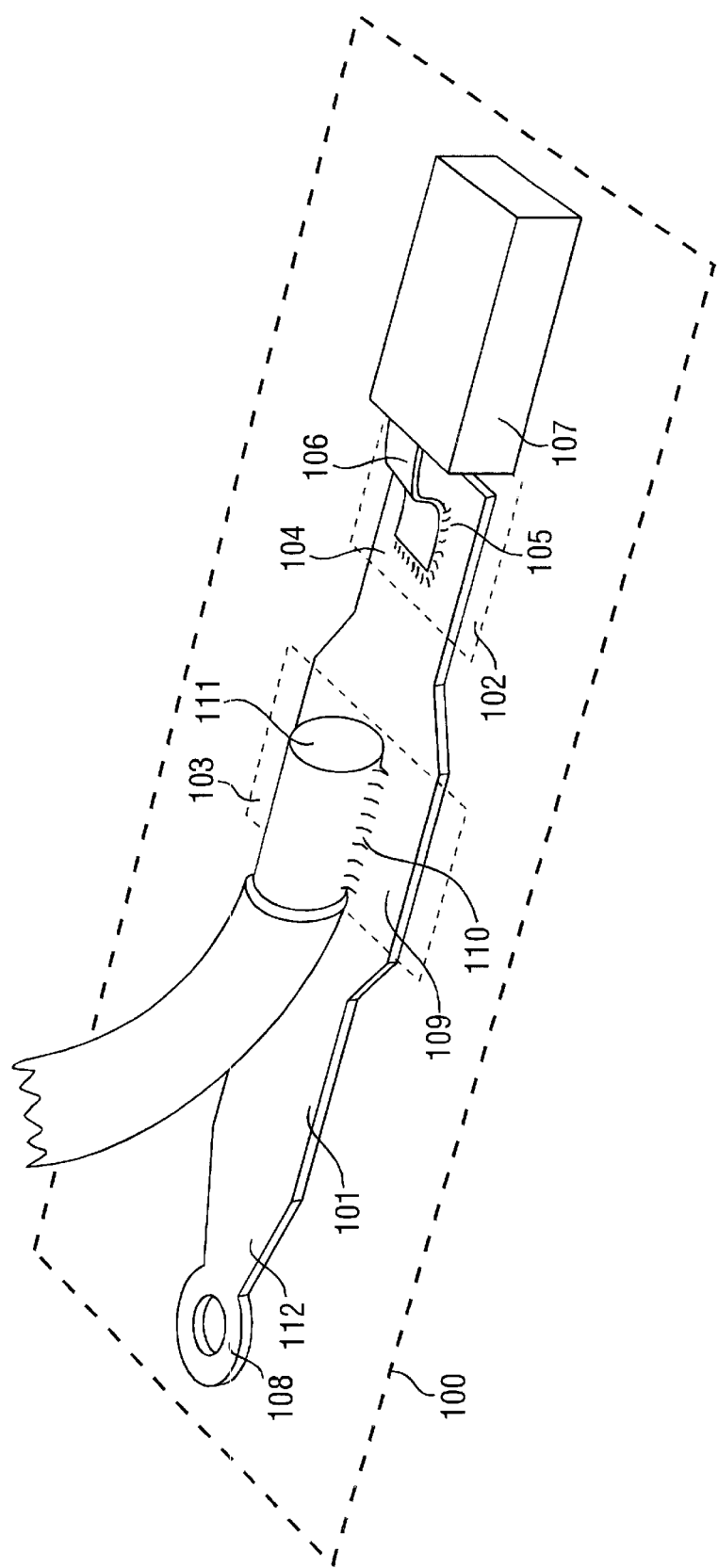
FIG. 1 is a three dimensional view of a PCB assembly that has been reworked.

Referring to FIG. 1, a PCB 100 contains at least one trace 101. The trace 101 is partially covered with a soldermask (not shown). However, portions 104 and 108 of the trace 101 are left exposed by reliefs 102 and 103 in the soldermask. A first portion 104 of the trace 101 is exposed by a first soldermask relief 102. The first soldermask relief 102 allows an intermetalic bond 105 between the first portion 104 of the trace 101 and a lead 106 of a component 107. The component 107 can be a surface mount component, a discrete component, a connector, or any other type of component conventionally used on PCBs. The bonding of the component 107 to the first portion 104 of the trace 101 is conventionally accomplished with the use of materials such as but not limited to solder, braze, weld material, and conductive epoxy. The trace 101 may connect the lead 106 of the component 107 to another component or to a power plane (not shown) through the use of a via 108. For the sake of clarity, only a single lead and a single trace are discussed. It should be understood that components have a plurality of leads, that PCBs have a plurality of trace 101s, and that the invention includes such embodiments.

Referring again to FIG. 1, a second portion 109 of the trace 101 is exposed by a second soldermask relief 103. The second soldermask relief 103 allows an intermetalic bond 110 between the second portion 109 of the trace 101 and a rework wire 111. This bond 110 is accomplished with the use of materials such as, but not limited to, solder, braze, weld material, and conductive epoxy.

Referring again to FIG. 1, one possible shape of the trace 101 is shown. As FIG. 1 shows, the width of the trace 101 varies along the length of the trace 101. The width of the second portion 109 of the trace 101 is increased from the width of the remaining portions of the trace 101 to facilitate manual bonding operations. This increase in width compensates for possible mismatching of the rework wire 111 with respect to the second portion 109 of the trace 101. In addition, FIG. 1 shows that the length of the second portion 109 of the trace 101 is greater than its width.

Again referring to FIG. 1, a third portion 112 of the trace 101 with a decreased width can be seen. When rework is performed, it is often necessary to sever a trace so that an electrical path can be redirected. This third portion 112 with a decreased width facilitates severing of the trace 101 if needed.

SOME ADVANTAGES OF THE INVENTION

An advantage of the invention is that it allows reworking of PCB. Many conventional PCBs are not reworkable. Thus, when a component becomes obsolete and no longer available, all PCBs in inventory must be scrapped. The invention allows reworking of PCBs that would otherwise be scrapped.

Another advantage of the invention is that it allows economical reworking of a PCB. Conventional methods of reworking PCBs are labor intensive. With the rising cost of labor, it is not economically feasible to rework many PCBs. The invention reduces the labor required to rework PCBs. Thus, rework becomes economically feasible.

Still another advantage of the invention is that it allows high reliability reworking. Conventional methods of reworking can damage components, traces and/or vias. This damage can result in failures over time. The invention allows reworking without damaging traces and vias because there is no need to scrape off a solder mask. Further, the invention allows reworking without damaging components because there is no need to solder a rework wire to a lead of a component.

Yet still another advantage of the invention is that it provides a low impedance rework path. By providing for a reliable bond of sufficient size, the impedance of the rework path can be minimized. A low impedance rework path is often critical when a trace connects a lead of a component to a power plane.

While the invention has been described in conjunction with specific embodiments thereof, it will be apparent to those of ordinary skill having the benefit of this disclosure that other modifications and changes therein in addition to the examples discussed above may be made by those skilled in the art without departing from the spirit and scope of the invention.

I claim:

1. A printed circuit board assembly comprising:
   (a) a component having a lead;
   (b) a trace;
   (c) a soldermask having a first relief, the first relief exposing a first portion of the trace, the first portion referred to as a first exposed trace, the lead being bonded to the first exposed trace, the soldermask having a second relief, the second relief exposing a second portion of the trace, the second portion referred to as a second exposed trace; and
   a wire bonded to the second exposed trace.

2. A printed circuit board assembly comprising:
   (a) a component having a lead;
   (b) a trace; and
   (c) a soldermask having a first relief, the first relief exposing a first portion of the trace, the first portion referred to as a first exposed trace, the lead being bonded to the first exposed trace, the soldermask having a second relief, the second relief exposing a second portion of the trace, the second portion referred to as a second exposed trace,
   wherein the second exposed trace has a length and a width, and the length is larger than the width.

3. A printed circuit board assembly comprising:
   (a) a surface mount component having a lead;
   (b) a trace, the trace having a length and a width that varies along the length, said trace being connected to a via;
   (c) a soldermask having a first relief, the first relief exposing a first portion of the trace, the first portion referred to as a first exposed trace, the soldermask having a second relief, the second relief exposing a second portion of the trace, the second portion referred to as a second exposed trace, the length of the second exposed trace being larger than the width of the second exposed trace, the lead being bonded to the first exposed trace; and
   (d) a wire bonded to the second exposed trace.

4. A printed circuit board assembly comprising:
   (a) a surface mount component having a lead;
   (b) a trace, the trace having a length and a width that varies along the length, said trace being connected to a power plane;
   (c) a soldermask having a first relief, the first relief exposing a first portion of the trace, the first portion referred to as a first exposed trace, the soldernask having a second relief, the second relief exposing a second portion of the trace, the second portion referred to as a second exposed trace, the length of the second exposed trace being larger than the width of the second exposed trace, the lead being bonded to the first exposed trace; and
   (d) a wire bonded to the second exposed trace.

* * * * *